US012581617B1

(12) United States Patent
Zhu et al.

(10) Patent No.: US 12,581,617 B1
(45) Date of Patent: Mar. 17, 2026

(54) IMMERSION LIQUID-COOLING SYSTEM AND METHOD, AND SERVER

(71) Applicant: Suzhou MetaBrain Intelligent Technology Co., Ltd., Suzhou (CN)

(72) Inventors: Huanlai Zhu, Suzhou (CN); An Wu, Suzhou (CN); Guangzhi Liu, Suzhou (CN)

(73) Assignee: Suzhou MetaBrain Intelligent Technology Co., Ltd., Suzhou (CN)

( * ) Notice: Subject to any disclaimer, the term of this patent is extended or adjusted under 35 U.S.C. 154(b) by 0 days.

(21) Appl. No.: 18/872,943

(22) PCT Filed: Jun. 27, 2023

(86) PCT No.: PCT/CN2023/102634
§ 371 (c)(1),
(2) Date: Dec. 9, 2024

(87) PCT Pub. No.: WO2024/131006
PCT Pub. Date: Jun. 27, 2024

(30) Foreign Application Priority Data

Dec. 22, 2022 (CN) .......................... 202211654933.3

(51) Int. Cl.
*H05K 7/20* (2006.01)
(52) U.S. Cl.
CPC ..... *H05K 7/20236* (2013.01); *H05K 7/20272* (2013.01); *H05K 7/20781* (2013.01)
(58) Field of Classification Search
CPC ........... H05K 7/20236; H05K 7/20272; H05K 7/20781; G06F 1/20
See application file for complete search history.

(56) References Cited

U.S. PATENT DOCUMENTS

| | | | | |
|---|---|---|---|---|
| 10,064,313 B2 * | 8/2018 | Ishinabe | ............ | H05K 7/20781 |
| 10,775,858 B2 * | 9/2020 | Mao | .................... | H01M 10/613 |

(Continued)

FOREIGN PATENT DOCUMENTS

| | | |
|---|---|---|
| CN | 109643047 A | 4/2019 |
| CN | 113365477 A | 9/2021 |

(Continued)

OTHER PUBLICATIONS

International Search Report cited in PCT/CN2023/102634, mailed Sep. 20, 2023, 7 pages.

(Continued)

*Primary Examiner* — Zachary Pape
(74) *Attorney, Agent, or Firm* — Cooper Legal Group, LLC

(57) ABSTRACT

An immersion liquid-cooling system and method, and a server are disclosed. The immersion liquid-cooling system includes a liquid distributor and a liquid collector, arranged at two sides of the immersion heat-exchange cavity, wherein the liquid distributor, the liquid collector and the immersion heat-exchange cavity being each provided with a plurality of flow channels, flow channel outlets of the liquid distributor being connected with flow channel inlets of the immersion heat-exchange cavity in a one-to-one correspondence manner, and flow channel outlets of the immersion heat-exchange cavity being connected with flow channel inlets of the liquid collector in a one-to-one correspondence manner; and cooling liquid distributed by the flow channels of the liquid distributor flowing out of the flow channels of the liquid collector along the flow channels of the immersion heat-exchange cavity to form liquid-cooling flow channels.

13 Claims, 6 Drawing Sheets

(56) References Cited

U.S. PATENT DOCUMENTS

| | | | | |
|---|---|---|---|---|
| 11,882,670 | B2 * | 1/2024 | Gao | H05K 7/20772 |
| 12,284,782 | B2 * | 4/2025 | Smith | F24T 10/30 |
| 2015/0334880 | A1 | 11/2015 | Best | |
| 2019/0357385 | A1 * | 11/2019 | Miyazaki | H05K 7/20236 |

FOREIGN PATENT DOCUMENTS

| | | | |
|---|---|---|---|
| CN | 113873849 | A | 12/2021 |
| CN | 114521093 | A | 5/2022 |
| CN | 115038303 | A | 9/2022 |
| CN | 115220545 | A | 10/2022 |
| CN | 115295955 | A | 11/2022 |
| CN | 115348799 | A | 11/2022 |
| CN | 115666112 | A | 1/2023 |
| JP | 2017191431 | A | 10/2017 |

OTHER PUBLICATIONS

Written Opinion cited in PCT/CN2023/102634, mailed Sep. 20, 2023, 10 pages.
Notification to Grant Patent Right for Invention cited in CN202211654933.3, mailed Mar. 16, 2023, 3 pages.
First Office Action cited in CN202211654933.3, mailed Feb. 3, 2023, 15 pages.
Second Office Action cited in CN202211654933.3, mailed Mar. 6, 2023, 17 pages.

* cited by examiner

IMMERSION LIQUID-COOLING SYSTEM AND METHOD, AND SERVER

CROSS-REFERENCE TO RELATED APPLICATION

This application claims priority to Chinese Patent Application No. 202211654933.3, filed on Dec. 22, 2022 in China National Intellectual Property Administration and entitled "Immersion Liquid-Cooling System and Method, and Server", which is hereby incorporated by reference in its entirety.

FIELD

The present application relates to the technical field of liquid cooling, in particular to an immersion liquid-cooling system and method, and a server.

BACKGROUND

Mainstream liquid-cooling heat dissipation methods mainly include cold-plate liquid-cooling heat dissipation and immersion liquid-cooling heat dissipation. The immersion liquid-cooling heat dissipation is that a server is immersed directly in insulated cooling liquid, and the heat produced by the operation of the server is taken away by the circulation of the cooling liquid. Compared with the cold-plate liquid-cooling heat dissipation, the immersion liquid-cooling heat dissipation is lower in noise and more energy-saving.

At present, common immersion liquid-cooling cabinets are immersion heat-exchange cavities with a length, width and height of about 2600×1000×1300 mm. Liquid flows in from the bottom of one side in the length direction, flows through vertical liquid-cooling servers arranged in parallel to take away the heat, and then overflows from the top of the other side in the length direction. However, the number of device nodes connected in parallel in the length direction of the whole immersion heat-exchange cavity reaches up to 54. In a bottom flow direction which accounts for the largest proportion of the cavity flow resistance, the flow path of the device node closest to an inlet is only about 44.45 mm at most, and the flow path of the device node furthest from the inlet is about 2500 mm. Even if the liquid is fed simultaneously from two sides of the length direction, the flow path of the device node closest to the inlet in the bottom flow direction is only 44.45 mm, and the flow path of the device nodes furthest from the inlet is still about 1250 mm, whereby there is still a difference of two orders of magnitude. Thus it can be seen that the difference between the flow paths of the device nodes is two orders of magnitude. That is, the on-way resistance loss of each device node has a difference of two orders of magnitude, which may inevitably lead to a huge difference in the flow rate of the device nodes with different flow paths, and it is found that the internal temperature of the device nodes with different flow paths are quite different in the actual measurement.

In addition, the traditional system architecture design mainly considers the comprehensive competitiveness of the device nodes and stable product performance. The cloud native system architecture design is based on computation, storage, input/output and decoupling of acceleration units in the overall dimension of data centers, emphasizing extremely simple design of various functional units based on specific applications. That is, a single device node focuses on the computation, storage, input/output or acceleration units. In this way, the power consumption and component temperature specifications of different device nodes vary greatly, and the inlet flow rate with the same temperature cannot meet the differential temperature flow rate requirements of different device nodes.

In the prior art, in order to solve the above technical problems, a conventional technical method is adopted as follows: a flow homogenization plate is additionally arranged at the bottom of the immersion heat-exchange cavity to eliminate the difference of flow rate to a certain extent. However, due to the difference of two orders of magnitude in the on-way resistance loss at the bottom inlet of the device nodes with different flow, the practical application is always quite different from the design; and the flow rate inside the remote device nodes can only be increased by increasing the flow rate of a circulating pump, thus consequently increasing the power consumption of the system, and increasing the power usage effectiveness (PUE, a ratio of all energy consumed by the data center to the energy used by IT loads) of the system, which is contrary to the concept of current green energy saving. Moreover, the conventional technical method cannot meet the completely same flow rate requirements of the same device node at the same time, i.e. the differentiated flow rate requirements of different device nodes due to different power consumption and different temperature specifications.

SUMMARY

Based on this, in order to solve the above technical problems, it is necessary to provide an immersion liquid-cooling system and method, and a server, which can improve the heat dissipation efficiency, reduce the energy consumption, and coordinate the differentiated flow rate requirements of the same device nodes and device nodes with different temperature specifications.

In one aspect, an immersion liquid-cooling system is provided. The system is applied to an immersion heat-exchange cavity, and the system includes:

a liquid distributor and a liquid collector which are arranged at two sides of the immersion heat-exchange cavity, wherein the liquid distributor, the liquid collector and the immersion heat-exchange cavity are each provided with a plurality of flow channels, flow channel outlets of the liquid distributor are connected with flow channel inlets of the immersion heat-exchange cavity in a one-to-one correspondence manner, and flow channel outlets of the immersion heat-exchange cavity are connected with flow channel inlets of the liquid collector in a one-to-one correspondence manner; and cooling liquid distributed by the flow channels of the liquid distributor flows out of the flow channels of the liquid collector along the flow channels of the immersion heat-exchange cavity to form liquid-cooling flow channels.

In one embodiment, the immersion heat-exchange cavity includes at least two device nodes that are connected in series in a sequence of temperature specifications from low to high; and a device node with the lowest temperature specification is closest to the liquid distributor, and a device node with the highest temperature specification is closest to the liquid collector.

In one embodiment, each device node includes a plurality of device units that are connected in parallel, and the flow channels are arranged between adjacent device units.

In one embodiment, the system also includes a heat exchanger. The heat exchanger communicates the liquid distributor with the liquid collector; and the cooling liquid flowing out of the liquid collector is cooled by the heat exchanger and then flows into the immersion heat-exchange cavity through the liquid distributor to form a liquid-cooling cycle.

In one embodiment, the liquid distributor includes a liquid collection pipe, a liquid cavity, and a flow homogenizer. Flow channels are arranged in the flow homogenizer; and the cooling liquid flows through the liquid collection pipe and the liquid cavity successively and flows into the immersion heat-exchange cavity along the flow channel of the flow homogenizer.

In one embodiment, a unidirectional deflector opening towards one side of the flow channel outlet of the flow distributor is arranged at the flow channel inlet of the liquid distributor.

In one embodiment, the liquid collector is arranged at the flow channel outlet of the preceding device node of the adjacent device nodes, and/or, the liquid distributor is arranged at the flow channel inlet of the succeeding device node of the adjacent device nodes.

In one embodiment, a length of the flow channel, and/or, a diameter of the flow channel is determined by the heat dissipation requirement of the device unit through which the cooling liquid flows.

In one embodiment, the liquid collector includes a liquid collection pipe, a liquid cavity, and a flow homogenizer. Flow channels is arranged in the flow homogenizer; and the cooling liquid flows out of the immersion heat-exchange cavity successively through the flow channel of the flow homogenizer, the liquid cavity, and the liquid collection pipe.

In one embodiment, a unidirectional deflector opening towards one side of the flow channel outlet of the flow collector is arranged at the flow channel inlet of the liquid collector.

In one embodiment, the liquid cavity is a hollow semi-circular arc-shaped shell, and the flow homogenizer is detachably connected with the liquid cavity.

In one embodiment, one side, close to the liquid cavity, of the flow homogenizer is in a semicircular arc shape.

In one embodiment, an arc-shaped convex surface of the flow homogenizer of the liquid collector protrudes towards one side of the liquid collection pipe of the liquid collector.

In one embodiment, an arc-shaped concave surface of the flow homogenizer of the liquid distributor is concave towards one side of the liquid collection pipe of the liquid distributor.

In one embodiment, one side, away from the liquid cavity, of the flow homogenizer is in a semicircular arc shape, and the arc-shaped concave surface of the flow homogenizer is concave towards one side of the liquid collection pipe.

In one embodiment, the system also includes a circulating pump, and a valve. The circulating pump is communicated with the heat exchanger and the liquid distributor; the cooling liquid cooled by the heat exchanger is pressurized by the circulating pump and then pumped into the liquid distributor; and the valve is arranged between the circulating pump and the liquid distributor.

In another aspect, an immersion liquid-cooling method is provided. The method utilizes an immersion liquid-cooling system to perform heat dissipation of an immersion heat-exchange cavity; and the method includes:

feeding cooling liquid to a liquid distributor, wherein the cooling liquid enters a flow channel of an immersion heat-exchange cavity through a flow channel of the liquid distributor to absorb the heat in the immersion heat-exchange cavity, and flows out of a liquid collector to form a liquid-cooling flow channel so as to achieve beat dissipation of the immersion heat-exchange cavity.

In one embodiment, the method also includes: arranging a heat exchanger between the liquid collector and the liquid distributor to cool the cooling liquid flowing out of the liquid collector, and re-feeding the cooled cooling liquid into the liquid distributor to form a liquid-cooling cycle.

In one embodiment, the method also includes: arranging temperature monitoring modules to a liquid collection pipe of the liquid distributor and the flow channel of the immersion heat-exchange cavity to monitor the temperature of the cooling liquid, wherein the number of the temperature monitoring module is at least one; and arranging a flow rate monitoring module to the liquid collection pipe of the liquid distributor to monitor the flow rate of the cooling liquid.

In one embodiment, the method also includes: arranging an alarm module to the immersion heat-exchange cavity, and when the temperature monitoring module monitors that the temperature of the cooling liquid is greater than a first preset value, and/or, when the flow rate monitoring module monitors that the flow rate of the cooling liquid is less than a second preset value, triggering the alarm module to issue an alarm.

In one embodiment, the method also includes: arranging an electromagnetic guide valve to the liquid collection pipe of the liquid distributor, and when the temperature monitoring module of the liquid collection pipe of the liquid distributor monitors that the temperature of the cooling liquid is greater than the first preset value, closing the electromagnetic guide valve to cut off a current liquid-cooling flow channel.

In a further aspect, a server is provided. The server includes an immersion liquid-cooling system; and the immersion-liquid cooling system includes: a liquid distributor and a liquid collector which are arranged at two sides of an immersion heat-exchange cavity. The liquid distributor, the liquid collector and the immersion heat-exchange cavity are each provided with a plurality of flow channels, flow channel outlets of the liquid distributor are connected with flow channel inlets of the immersion heat-exchange cavity in a one-to-one correspondence manner, and flow channel outlets of the immersion heat-exchange cavity are connected with flow channel inlets of the liquid collector in a one-to-one correspondence manner; and cooling liquid distributed by the flow channels of the liquid distributor flows out of the flow channels of the liquid collector along the flow channels of the immersion heat-exchange cavity to form liquid-cooling flow channels.

The immersion liquid-cooling system and method, and the server are provided. The system is applied to the immersion heat-exchange cavity, and the system includes: the liquid distributor and the liquid collector which are arranged at two sides of the immersion heat-exchange cavity. The liquid distributor, the liquid collector and the immersion heat-exchange cavity are each provided with a plurality of flow channels, the flow channel outlets of the liquid distributor are connected with the flow channel inlets of the immersion heat-exchange cavity in a one-to-one correspondence manner, and the flow channel outlets of the immersion heat-exchange cavity are connected with the flow channel inlets of the liquid collector in a one-to-one correspondence manner; and the cooling liquid distributed by the flow channels of the liquid distributor flows out of the flow channels of the liquid collector through the flow channels of the immersion heat-exchange cavity to form the liquid-cooling flow channels. By arranging the liquid distributor and the liquid collector at two sides of the immersion heat-exchange cavity, the cooling liquid can be fed into the immersion heat-exchange cavity without a pressurizing apparatus to form the liquid-cooling flow channels, thereby achieving heat dissipation of the immersion heat-exchange cavity.

Further, the immersion heat-exchange cavity includes at least two device nodes that are connected in series in a sequence of temperature specifications from low to high; the device node with the lowest temperature specification is closest to the liquid distributor, and the device node with the highest temperature specification is closest to the liquid collector; and the device nodes are connected in series sequentially according to the temperature specifications to meet the liquid-cooling requirement of the device nodes with different temperature specifications, thereby reducing the economic cost, and reducing resource losses.

Further, the same device units are connected in parallel to generate the device nodes, and the flow channels are arranged between the device units, whereby the same heat dissipation requirements of the same device units are met, the heat dissipation efficiency is improved, and the heat dissipation effect is enhanced.

Figure 1:
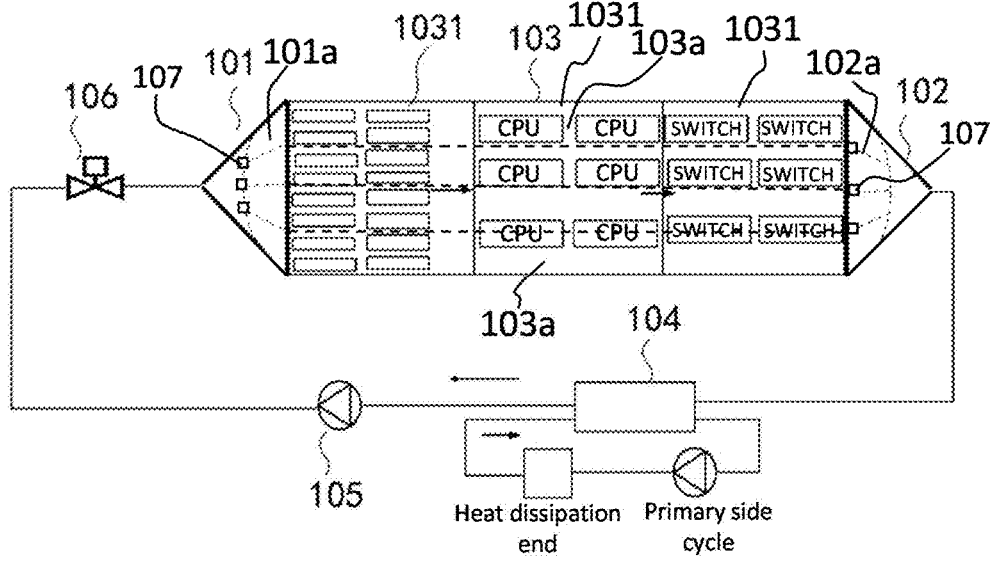
FIG. 1 is a schematic structural diagram of an immersion liquid-cooling system in one embodiment.

Reference numerals in the drawings: 101, liquid distributor; 102, liquid collector; 1021, liquid collection pipe; 1022, liquid cavity; 1023, flow homogenizer; 103, immersion heat-exchange cavity; 1031, device node; 10311, device unit; 104, heat exchanger; 105, circulating pump; 106, valve.

DETAILED DESCRIPTION

To make the objectives, technical solutions, and advantages of the present application clearer, the following further describes the present application in detail with reference to the accompanying drawings and the embodiments. It is to be understood that the specific embodiments described herein are only used to explain the present application, and not to limit the present application.

Figure 2:
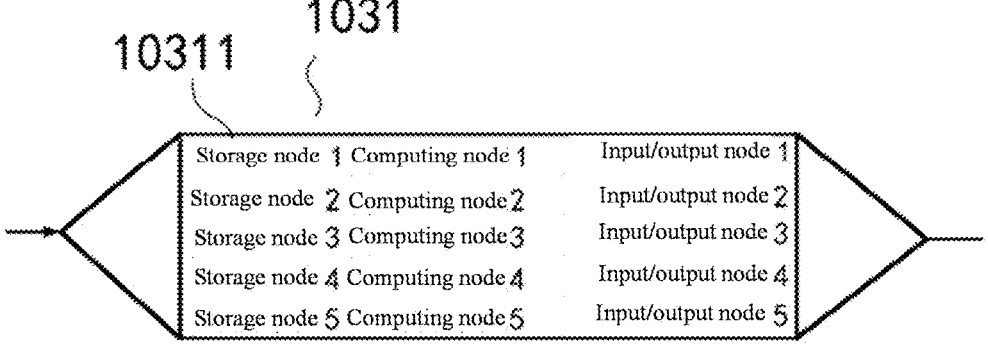
FIG. 2 is a schematic structural diagram of an immersion heat-exchange cavity in one embodiment.

The present application provides an immersion liquid-cooling system; as shown in FIG. 1, the system is applied to an immersion heat-exchange cavity as shown in FIG. 2; and the system includes:

a liquid distributor 101 and a liquid collector 102 which are arranged at two sides of the immersion heat-exchange cavity 103.

The liquid distributor 101, the liquid collector 102, and the immersion heat-exchange cavity 103 are each provided with flow channels 101a, 102a, 103a; cooling liquid distributed by the flow channels 101a of the liquid distributor 101 flows out of the flow channels 102a of the liquid collector 102 along the flow channels 103a of the immersion heat-exchange cavity 103 to form liquid-cooling flow channels.

Specifically, as shown in FIG. 1, the liquid distributor 101 is arranged at the left side of the immersion heat-exchange cavity 103, and the liquid collector 102 is arranged at the right side of the immersion heat-exchange cavity 103.

In one embodiment, the immersion heat-exchange cavity 103 is as shown in FIG. 2, the immersion heat-exchange cavity 103 includes at least two device nodes 1031 which are connected in series laterally in a sequence of temperature specifications from low to high; a device node 1031 with the lowest temperature specification is closest to the liquid distributor 101, and a device node 1031 with the highest temperature specification is closest to the liquid collector 102. In this way, the heat dissipation of a plurality of different device nodes 1031 can be achieved by feeding the cooling liquid into the liquid distributor 101 at one time, thereby reducing the resource consumption, and improving the heat dissipation efficiency.

Figure 3:
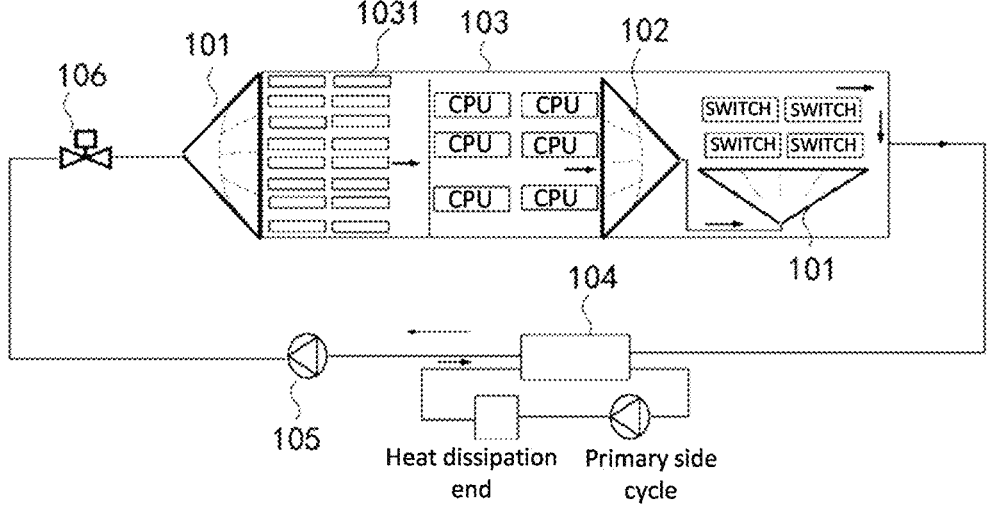
FIG. 3 is a schematic structural diagram of an immersion heat-exchange system in one embodiment.

Specifically, as shown in FIG. 2, the immersion heat-exchange cavity 103 includes a CXL storage node, a high-density computing node, and an input/output node which are sequentially connected in series. The temperature specification of the CXL storage node is 85° C., the temperature specification of the high-density computing node is 100° C., and the temperature specification of the input/output node is 120° C. The above device nodes 1031 are arranged in the immersion heat-exchange cavity 103 in serial connection according to a sequence of temperature specifications from low to high; and as long as the temperature of the cooling liquid fed into the liquid distributor 101 is lower than the temperature of the device node 1031 with the lowest temperature specification, the heat dissipation and cooling of the device nodes 1031 in the immersion heat-exchange cavity 103 can be achieved. In the immersion heat-exchange cavity 103 formed by the CXL storage node, the high-density computing node, and the input/output node, the CXL storage node is connected with the liquid distributor. On the one hand, because the temperature specification of a CXL storage device in the CXL storage node is the lowest, and on the other hand, because the structural shape of a DIMM strip of the CXL storage device has a flow homogenization function, which can play a role in homogenizing the cooling liquid. It is to be understood that in an actual application scenario, the flow direction of the flow channel of the device node 1031 is not limited. As shown in FIG. 3, the flow channels 103a of the device nodes 1031 in the same immersion heat-exchange cavity 103 can be arranged horizontally, and can also be arranged vertically. When the flow direction of the flow channel changes, it is only necessary to arrange the liquid collector 102 at a liquid outlet of the device node 1031 before the flow direction of the flow channel changes, and arrange the liquid distributor 101 at a liquid inlet of the device node 1031 with the flow direction of the flow channel changed, whereby the cooling liquid flowing out of the liquid collector 102 can flow into the liquid distributor 101 successfully, and the flow channel of the liquid distributor 101 is communicated with the flow channel of the device node 1031.

In one embodiment, each device node 1031 includes a plurality of device units 10311 that are connected in parallel; and the flow channels 103*a* are arranged between the adjacent device units 10311. By arranging a plurality of flow channels 103*a* in the immersion heat-exchange cavity 103, the immersion heat-exchange cavity 103 is cooled, thereby improving the heat dissipation effect.

Figure 5:
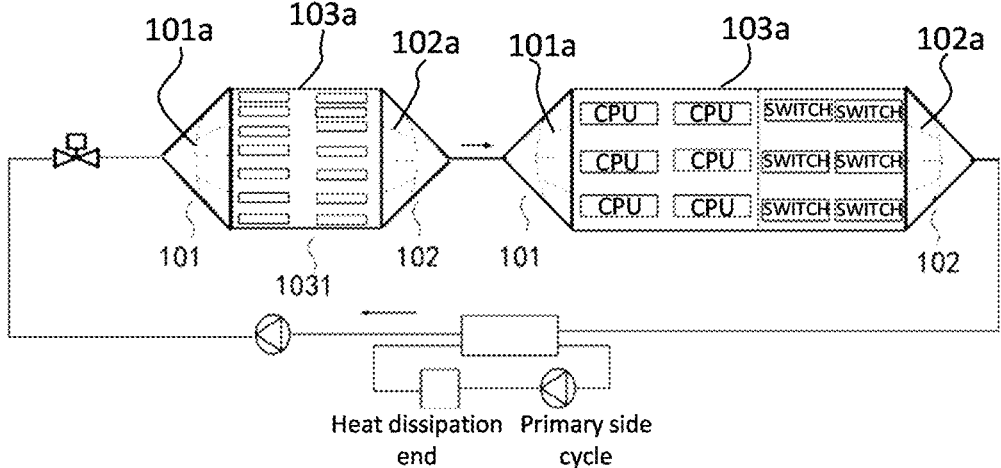
FIG. 5 is a schematic structural diagram of an immersion heat-exchange system in one embodiment.

In one embodiment, when there are a plurality of flow channels 103*a* in the preceding device node 1031 of the adjacent device nodes 1031, and there are a plurality of flow channels 103*a* in the succeeding device node 1031, as shown in FIG. 5, the system also includes: the liquid collector 102 arranged at the flow channel outlet of the preceding device node 1031 of the adjacent device nodes 1031, and the liquid distributor 101 arranged at the flow channel inlet of the succeeding device node 1031 of the adjacent device nodes 1031. The liquid collector 102 is arranged at the flow channel outlet of the CXL storage node in the immersion heat-exchange cavity 103, and the liquid distributor 101 is arranged at the flow channel inlet of the high-density computing node that is connected serially with the CXL storage node. The liquid collector 102 is arranged at the flow channel outlet of the preceding device node 1031 of the adjacent device nodes 1031, which plays a role in equalizing the temperature of the cooling liquid in different flow channels 103*a* of any device node; that is, in the actual application scenario, it is common that the actual temperature of different device units 10311 in the same device node 1031 is different, and when the actual temperature of different device units 10311 is different, the temperature of the cooling liquid in different flow channels 103*a* in the device node may also be different; and by arranging the liquid collector 102 at the flow channel outlet of the device node 1031, the cooling liquid in any flow channel in the device node 1031 is mixed in a liquid cavity 1022 of the liquid collector 102 to achieve a beneficial effect of precisely controlling the temperature of the cooling liquid, whereby the damage of the device unit of the next device node caused by directly inputting the cooling liquid with high temperature into the flow channel of the next device node can be avoided. The liquid distributor 101 is arranged at the flow channel inlet of the succeeding device node 1031 of the adjacent device nodes 1031, which plays a role in re-homogenizing the cooling liquid with the temperature equalized by the liquid collector 102 and enabling the cooling liquid to flow into the flow channel of the succeeding device node. It is to be understood that when there are a plurality of flow channels 103*a* both in the preceding device node 1031 and the succeeding device node 1031, the number of the flow channels 103*a* of the succeeding device node 1031 is unnecessary to be completely equal to the number of flow channels 103*a* of the succeeding device node 1031.

Figure 4:
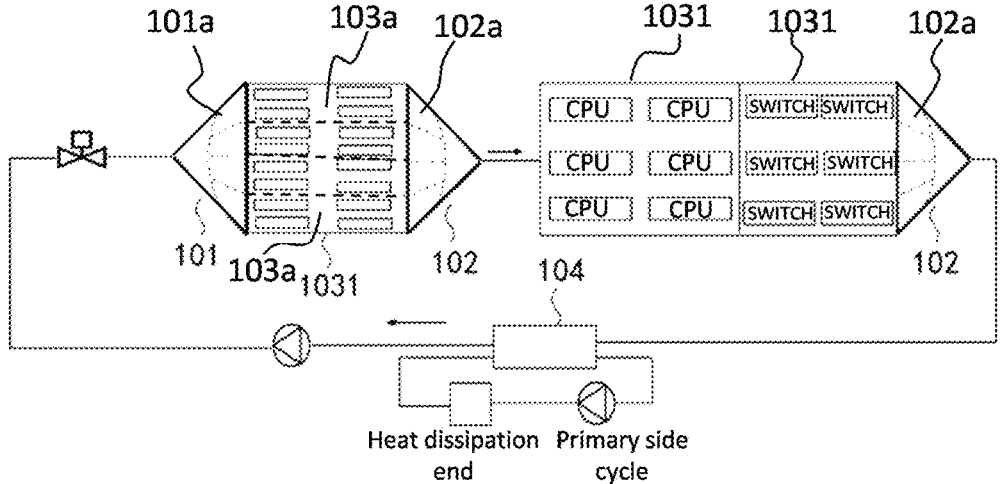
FIG. 4 is a schematic structural diagram of an immersion heat-exchange system in one embodiment.

In one embodiment, when there are a plurality of flow channels 103*a* in the preceding device node 1031 of the adjacent device nodes 1031, and there is a single flow channel in the succeeding device node 1031, as shown in FIG. 4, the system includes: the liquid collector 102 arranged at the flow channel outlet of the preceding device node 1031 of the adjacent device nodes 1031, a liquid collection pipe 1021 of the liquid collector 102 being communicated with the flow channel of the succeeding device node 1031. The cooling liquid in the flow channel of the preceding device node 1031 is temperature equalized in the liquid cavity of the liquid collector 102, and then flows into the flow channel of the succeeding device node 1031 along the liquid collection pipe 1021 of the liquid collector 102.

Figure 6:
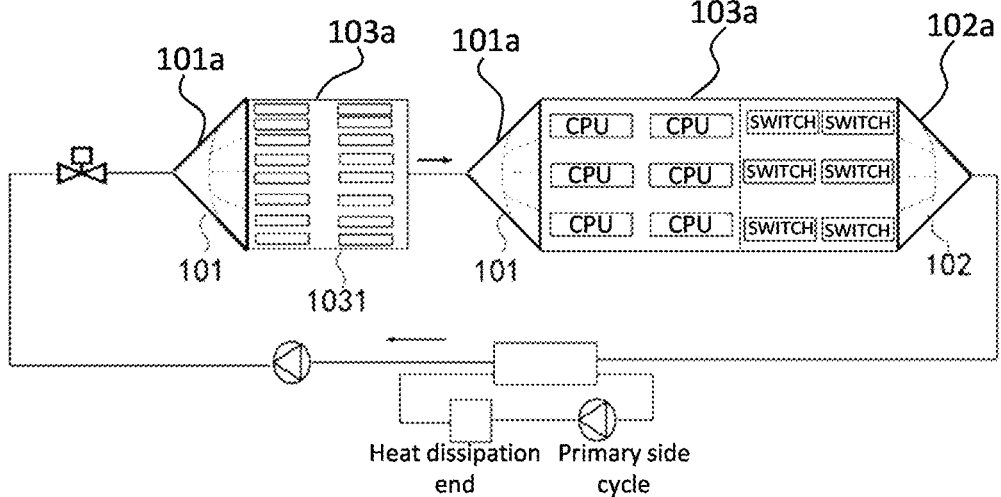
FIG. 6 is a schematic structural diagram of an immersion heat-exchange system in one embodiment.

In one embodiment, when there is a single flow channel in the preceding device node 1031 of the adjacent device nodes 1031, and there are a plurality of flow channels 103*a* in the succeeding device node 1031, as shown in FIG. 6, the system includes: the liquid distributor 101 arranged at the flow channel inlet of the succeeding device node 1031 of the adjacent device nodes 1031, a liquid collection pipe 1021 of the liquid distributor 101 being communicated with the flow channel of the preceding device node 1031. The cooling liquid in the flow channel of the preceding device node 1031 is flow homogenized by the liquid distributor 101, and then flows into the flow channels 103*a* of the succeeding device node 1031.

Based on the above immersion liquid-cooling system, the heat dissipation efficiency can be improved, the resource consumption can be reduced, and the differentiated flow rate requirements of the same device nodes 1031 and the device nodes 1031 with different temperature specifications can be coordinated.

In one embodiment, the system also includes: a heat exchanger 104. The heat exchanger 104 is communicated with the liquid collector 102 and the liquid distributor 101; and the cooling liquid flowing out of the liquid collector 102 is cooled by the heat exchanger 104 and then flows into the immersion heat-exchange cavity 103 again through the liquid distributor 101 to form a liquid-cooling cycle. The cooling liquid flowing out of the liquid collector 102 is fed into the heat exchanger 104 to be cooled, then the cooled cooling liquid is re-fed into the liquid distributor 101 to perform heat dissipation and cooling of the device nodes 1031/device units 10311 in the immersion heat-exchange cavity 103 to form the liquid-cooling cycle, thereby increasing the utilization rate of resources, and having a green and energy-saving beneficial effect.

In one embodiment, the liquid distributor 101 includes a liquid collection pipe 1021, a liquid cavity 1022, and a flow homogenizer 1023. Flow channels 102*a* are arranged in the flow homogenizer 1023; the cooling liquid flows through the liquid collection pipe 1021 and the liquid cavity 1022 successively and flows into the immersion heat-exchange cavity 103 along the flow channel 102*a* of the flow homogenizer 1023. The flow channels 102*a* are arranged inside the flow homogenizer 1023 to distribute the cooling liquid in the liquid distributor 101, whereby the cooling liquid is fed into the flow channels 103*a* of the immersion heat-exchange cavity 103 communicated with the flow channels 101*a* of the liquid distributor 101. The liquid distributor 101 includes a liquid collector 1021, a liquid cavity 1022, and a flow homogenizer 1023. The flow homogenizer 1023 includes a plurality of flow channels 102*a* with the same length and same diameter; the cooling liquid flows through the liquid collection pipe 1021 to enter the liquid cavity 1022, which can decrease the flow rate of the cooling liquid to be approximate to a stationary state; then the cooling liquid with the flow rate approximate to the stationary state flows into the flow channels 103*a* of the immersion beat-exchange cavity 103 through the flow channels 102*a* of the flow homogenizer 1023, and the local resistance loss coefficient is a constant, and thus, the flow rate of the cooling liquid in any flow channel 102*a* of the flow homogenizer 1023 is the same, and the resistance at the liquid inlet and liquid outlet of any flow channel 101*a*, 102*a*, 103*a* is the same, whereby the poor heat dissipation effect caused by the excessively high flow rate of the cooling liquid can be avoided.

In one embodiment, unidirectional deflectors 107 opening towards one side of the flow channel outlet of the flow distributor 101 are arranged at the flow channel inlet of the liquid distributor 101, which can ensure that the cooling liquid enters the immersion heat-exchange cavity 103 successfully on the one hand, and can prevent the backflow of the cooling liquid in the flow channels 103a on the other hand.

Figure 7:
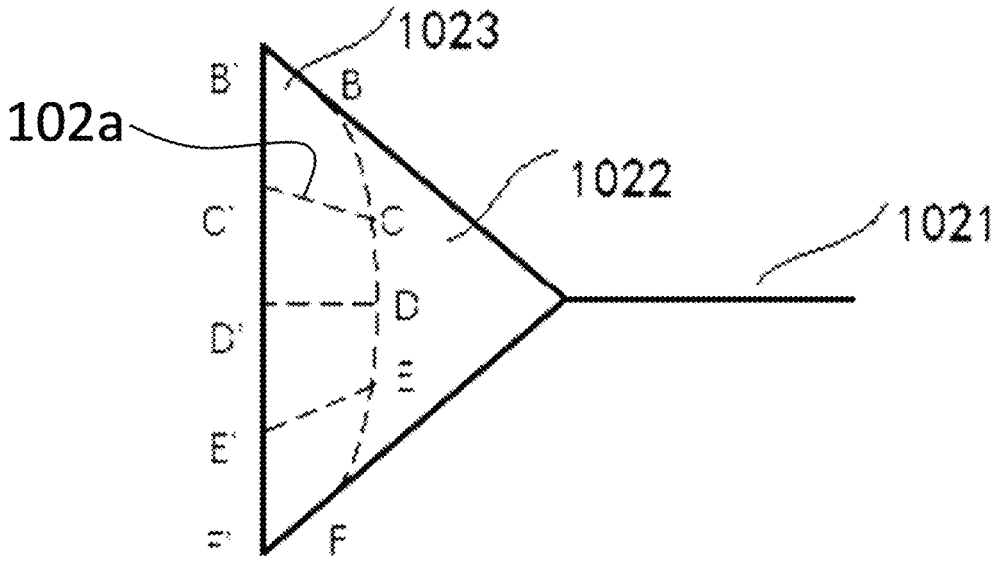
FIG. 7 is a schematic structural diagram of a liquid collector/liquid distributor in one embodiment.

In one embodiment, as shown in FIG. 7, the liquid collector 102 includes a liquid collection pipe 1021, a liquid cavity 1022, and a flow homogenizer 1023. Flow channels 102a are arranged in the flow homogenizer 1023; and the cooling liquid flows out of the immersion heat-exchange cavity 103 successively through the flow channel 102a of the flow homogenizer 1023, the liquid cavity 1022 and the liquid collection pipe 1021.

In one embodiment, unidirectional deflectors 107 opening towards one side of the flow channel outlet of the flow collector 102 are arranged at the flow channel inlet of the liquid collector 102, which is beneficial for the cooling liquid in the flow channels 103a of the immersion heat-exchange cavity 103 to flow out of the immersion heat-exchange cavity 103 on the one hand, and prevents the backflow of the cooling liquid from damaging the device nodes 1031 in the immersion heat-exchange cavity 103 on the other hand. As shown in FIG. 7, BB', CC', DD', EE' and FF' are the flow channels 102a of the flow homogenizer, and the structure of the liquid distributor 101 is similar to the structure of the liquid collector 102 shown in FIG. 7, whereby no more details are described here.

In one embodiment, a length of the flow channel, and/or, a diameter of the flow channel is determined by the heat dissipation requirement of the device unit through which the cooling liquid flows. It is to be understood that whether for the flow channels 101a of the liquid distributor 101, the flow channels 102a of the liquid collector 102, or the flow channels 103a of the immersion heat-exchange cavity 103, the length or the diameter of the flow channels in the same structure unit (i.e. the liquid distributor 101, the liquid collector 102 or the immersion heat-exchange cavity 103) can be the same or different; that is, the flow channel can be arranged in a rectilinear or a nonlinear shape by those skilled in the art to change the length of the flow channel. Specifically, for example, in the actual situation, the working energy consumption and temperature specifications of different device nodes are different, the length of the flow channels at the device node with high temperature specification and large working energy consumption can be increased appropriately to improve the heat dissipation efficiency and enhance the cooling effect. Similarly, the diameter of the flow channels at the device node with high temperature specification and large working energy consumption can also be increased to increase the flow rate of the cooling liquid at the device node so as to improve the heat dissipation efficiency. Further, based on the above concept, those skilled in the art can determine the length and the diameter of the flow channels between different device units in the same device node according to the actual application scenario. It is to be noted that no matter how the diameter of the flow channel in the immersion heat-exchange cavity 103 changes, the communication tightness between the flow channel and the flow channel of the liquid distributor 101/liquid collector 102 is guaranteed to ensure no leakage of the cooling liquid.

In one embodiment, the flow channel 101a of the liquid distributor 101 is communicated with at least one flow channel 103a of the immersion heat-exchange cavity 103 to improve the heat dissipation efficiency of the device unit 10311; and the flow channel 102a of the liquid collector 102 is communicated with each flow channel 103a of the immersion heat-exchange cavity 103 to ensure that the cooling liquid in any flow channel can flow out successfully, whereby the situation that the device node 1031 cannot dissipate the heat and is damaged because the cooling liquid cannot flow out can be avoided.

In one embodiment, the liquid cavity 1022 is a hollow semicircular arc-shaped shell, and the flow homogenizer 1023 is detachably connected with the liquid cavity 1022. The flow homogenizer 1023 and the liquid cavity 1022 are configured in a detachable connection structure, which is beneficial for cleaning the flow channels 101a, 102a of the liquid distributor 101 and the flow homogenizer 1023, whereby the situation that the cooling liquid cannot flow in/out of the immersion heat-exchange cavity 103 successfully due to the blockage of the liquid cavity 1022 or the flow channel can be avoided.

Figure 9:
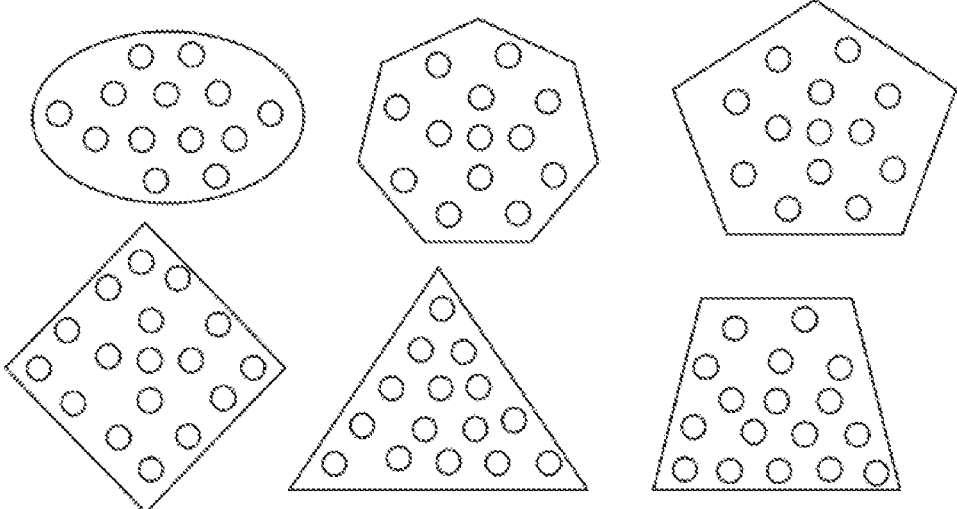
FIG. 9 is a schematic diagram of a side shape of a flow homogenizer in one embodiment.

In one embodiment, the sectional shape of one side, connected with the immersion heat-exchange cavity 103, of the flow homogenizer 1023 is non-unique, that is, the shape of the side surface of the flow homogenizer 1023 is not limited, and the side surface of the flow homogenizer 1023 can be configured by those skilled in the art in a triangular shape, a diamond shape, a hexagonal shape, a trapezoidal shape, a rectangular shape, a parallelogram shape or any polygonal shape as shown in FIG. 9 according to the shape of the side surface of the immersion heat-exchange cavity 103 or other actual situations; and regardless of the shape, it is necessary to ensure the tight communication between the flow channels 102a of the flow homogenizer 1023 and the flow channels 103a in the immersion heat-exchange cavity 103, and ensure that the cooling liquid can enter the flow channels 103a of the immersion heat-exchange cavity 103 successfully through the flow channels 102a of the flow homogenizer 1023.

Figure 8:
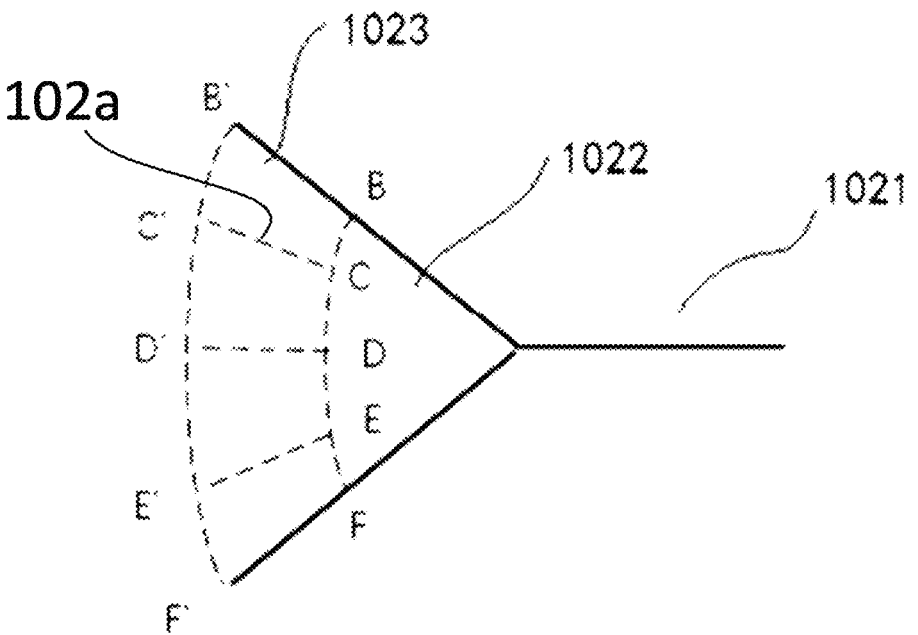
FIG. 8 is a schematic structural diagram of a liquid collector/liquid distributor in one embodiment.

In one embodiment, as shown in FIG. 8, one side, close to the liquid cavity 1022, of the flow homogenizer 1023 is in a semicircular arc shape. One side of the liquid cavity 1022 is configured in a semicircular arc shape, which can reduce the flow resistance of the cooling liquid greatly.

In one embodiment, an arc-shaped convex surface of the flow homogenizer 1023 of the liquid collector 102 protrudes towards one side of the liquid collection pipe 1021 of the liquid collector 102, which can reduce the resistance to the cooling liquid, and increase the rate of the cooling liquid flowing out of the liquid collector 102.

In one embodiment, an arc-shaped concave surface of the flow homogenizer 1023 of the liquid distributor 101 is concave towards one side of the liquid collection pipe 1021 of the liquid distributor 101, which has a beneficial effect of reducing the resistance to the cooling liquid, and increasing the rate of the cooling liquid flowing into the liquid distributor 101.

In one embodiment, as shown in FIG. 8, one side, away from the liquid cavity 1022, of the flow homogenizer 1023 is in a semicircular arc shape, and the arc-shaped concave surface of the flow homogenizer 1023 is concave towards one side of the liquid collection pipe 1021. It is to be understood that one side, away from the liquid cavity 1022, of the flow homogenizer 1023 is the side, close to the immersion heat-exchange cavity 103, of the flow homogenizer 1023, that is, the flow homogenizer 1023 is connected with the immersion heat-exchange cavity so as to feed the cooling liquid into one side of the flow channel 103a in the immersion heat-exchange cavity. One side, away from the liquid cavity 1022, of the flow homogenizer 1023 is configured in a semicircular arc shape, which can reduce the resistance to the cooling liquid on the one hand, whereby the cooling liquid can flow into the flow channels 103*a* of the immersion heat-exchange cavity more rapidly and smoothly. It is to be understood that in an actual application scenario, two sides of the immersion heat-exchange cavity are concave, that is, there is no situation that the immersion heat-exchange cavity is unmatched with the liquid distributor 101/liquid collector 102. Moreover, it is to be understood that in the actual application scenario, the tight connection between the liquid distributor 101/liquid collector 102 and the immersion heat-exchange cavity is not necessary, as long as the flow channels 101*a*, 102*a* of the liquid distributor 101/liquid collector 102 are ensured to be tightly communicated with the flow channels 103*a* of the immersion heat-exchange cavity, and the cooling liquid can flow into the flow channels 103*a* of the immersion heat-exchange cavity successfully from the flow channels 101*a*, 102*a* of the liquid distributor 101/liquid collector 102. Specifically, a nozzle may also be arranged at one side, close to the immersion heat-exchange cavity, of a pipeline of the flow homogenizer 1023, whereby after flowing through the pipeline of the flow homogenizer 1023, the cooling liquid flows into the immersion heat-exchange cavity from the nozzle.

In one embodiment, the system also includes a circulating pump 105 and a valve 106. The circulating pump 105 is communicated with the heat exchanger 104 and the liquid distributor 101, and the cooling liquid cooled by the heat exchanger 104 is pressurized by the circulating pump 105 and then pumped into the liquid distributor 101. The valve 106 is arranged between the circulating pump 105 and the liquid distributor 101. By arranging the circulating pump 105, the rate of feeding the cooling liquid into the immersion heat-exchange cavity 103 is increased, thereby increasing the rate of cooling the immersion heat-exchange cavity 103.

In one embodiment, an immersion liquid-cooling method is provided: the method utilizes the above immersion liquid-cooling system to perform heat dissipation of an immersion heat-exchange cavity 103; and the method includes:

feeding cooling liquid into the liquid distributor 101, wherein the cooling liquid flows into the flow channels 103*a* of the immersion heat-exchange cavity 103 through flow channels 101*a* of the liquid distributor 101 to absorb the heat in the immersion heat-exchange cavity 103 and flows out of the liquid collector 102 to form liquid-cooling flow channels so as to achieve heat dissipation of the immersion heat-exchange cavity 103.

In one embodiment, the method also includes: arranging a heat exchanger 104 between the liquid collector 102 and the liquid distributor 101 to cool the cooling liquid flowing out of the liquid collector 102 and re-feed the cooled cooling liquid into the liquid distributor 101 to form a liquid-cooling cycle.

In one embodiment, the method also includes: arranging a temperature monitoring module to a liquid collection pipe 1021 of the liquid distributor 101 and the flow channels 103*a* of the immersion heat-exchange cavity 103 to monitor the temperature of the cooling liquid, wherein the number of the temperature monitoring module is at least one; and arranging a flow rate monitoring module to the liquid collection pipe 1021 of the liquid distributor 101 to monitor a flow rate of the cooling liquid.

In one embodiment, the method also includes: arranging an alarm module to the immersion heat-exchange cavity 103, and when the temperature monitoring module monitors that the temperature of the cooling liquid is greater than a first preset value, and/or, when the flow rate monitoring module monitors that the flow rate of the cooling liquid is less than a second preset value, triggering the alarm module to issue an alarm. Specifically, various alarm methods can be set by those skilled in the art according to the actual application scenario. For example, when the flow rate monitoring module monitors that the flow rate of the cooling liquid is less than the second preset value, the alarm module issues a first alarm, and when the temperature monitoring module monitors that the temperature of the cooling liquid is greater than the first preset value, the alarm module issues a second alarm. Further, a temperature monitoring module can also be arranged in front of each device node 1031, and an alarm way is set correspondingly for each temperature monitoring module, whereby on the one hand, the temperature of the cooling liquid can be monitored to prevent the damage of the device unit 10311 of the device node 1031 due to the excessively high temperature of the cooling liquid, and on the other hand, the problem can be conveniently positioned in time by those skilled in the art.

In one embodiment, the method also includes: arranging an electromagnetic guide valve to the liquid collection pipe 1021 of the liquid distributor 101, and when the temperature monitoring module in the liquid collection pipe 1021 of the liquid distributor 101 monitors that the temperature of the cooling liquid is greater than the first preset value, closing the electromagnetic guide valve to cut off a current liquid-cooling flow channel.

In one embodiment, a server is provided; and the server includes an immersion liquid-cooling system, and the system includes:

a liquid distributor 101 and a liquid collector 102 which are arranged at two sides of an immersion heat-exchange cavity 103.

The liquid distributor 101, the liquid collector 102 and the immersion heat-exchange cavity 103 are each provided with a plurality of flow channels 101*a*, 102*a*, 103*a*, flow channel outlets of the liquid distributor 101 are connected with flow channel inlets of the immersion heat-exchange cavity 103 in a one-to-one correspondence manner, and flow channel outlets of the immersion beat-exchange cavity 103 are connected with flow channel inlets of the liquid collector 102 in a one-to-one correspondence manner; and cooling liquid distributed by the flow channels 101*a* of the liquid distributor 101 flows out of the flow channels 102*a* of the liquid collector 102 along the flow channels 103*a* of the immersion heat-exchange cavity 103 to form liquid-cooling channels.

In one embodiment, the immersion heat-exchange cavity 103 includes at least two device nodes 1031 which are connected in series in a sequence of temperature specifications from low to high; a device node 1031 with the lowest temperature specification is closest to the liquid distributor 101, and a device node 1031 with the highest temperature specification is closest to the liquid collector 102.

In one embodiment, the device node 1031 includes a plurality of device units 10311 that are connected in parallel, and the flow channels 103*a* are arranged between adjacent device units 10311.

In one embodiment, the system also includes a heat exchanger 104. The heat exchanger 104 is communicated with the liquid collector 102 and the distributor 101; and the cooling liquid flowing out of the liquid collector 102 is cooled by the heat exchanger 104 and then flows into the immersion heat-exchange cavity 103 through the liquid distributor 101 to form a liquid-cooling cycle.

In one embodiment, the liquid distributor 101 includes a liquid collection pipe 1021, a liquid cavity 1022 and a flow homogenizer 1023. Flow channels 102a are arranged in the flow homogenizer 1023; and the cooling liquid flows through the liquid collection pipe 1021 and the liquid cavity 1022 successively and flows into the immersion heat-exchange cavity 103 along the flow channel 102a of the flow homogenizer 1023.

In one embodiment, unidirectional deflectors 107 opening towards one side of a flow channel outlet of the flow distributor 101 are arranged at a flow channel inlet of the liquid distributor 101.

In one embodiment, the liquid collector 102 includes a liquid collection pipe 1021, a liquid cavity 1022 and a flow homogenizer 1023. Flow channels 102a are arranged in the flow homogenizer 1023; and the cooling liquid flows out of the immersion heat-exchange cavity 103 successively through the flow channel 102a of the flow homogenizer 1023, the liquid cavity 1022 and the liquid collection pipe 1021.

In one embodiment, unidirectional deflectors 107 opening towards one side of a flow channel outlet of the flow collector 102 are arranged at a flow channel inlet of the liquid collector 102.

In one embodiment, the liquid cavity 1022 is a hollow semicircular arc-shaped shell, and the flow homogenizer 1023 is detachably connected with the liquid cavity 1022.

In one embodiment, one side, close to the liquid cavity 1022, of the flow homogenizer 1023 is in a semicircular arc shape.

In one embodiment, an arc-shaped convex surface of the flow homogenizer 1023 of the liquid collector 102 protrudes towards one side of the liquid collection pipe 1021 of the liquid collector 102.

In one embodiment, an arc-shaped concave surface of the flow homogenizer 1023 of the liquid distributor 101 is concave towards one side of the liquid collection pipe 1021 of the liquid distributor 101.

In one embodiment, the system also includes a circulating pump 105 and a valve 106; the circulating pump 105 is communicated with the heat exchanger 104 and the liquid distributor 101. The cooling liquid cooled by the heat exchanger 104 is pressurized by the circulating pump 105 and then pumped into the liquid distributor 101. The valve 106 is arranged between the circulating pump 105 and the liquid distributor 101.

Figure 10:
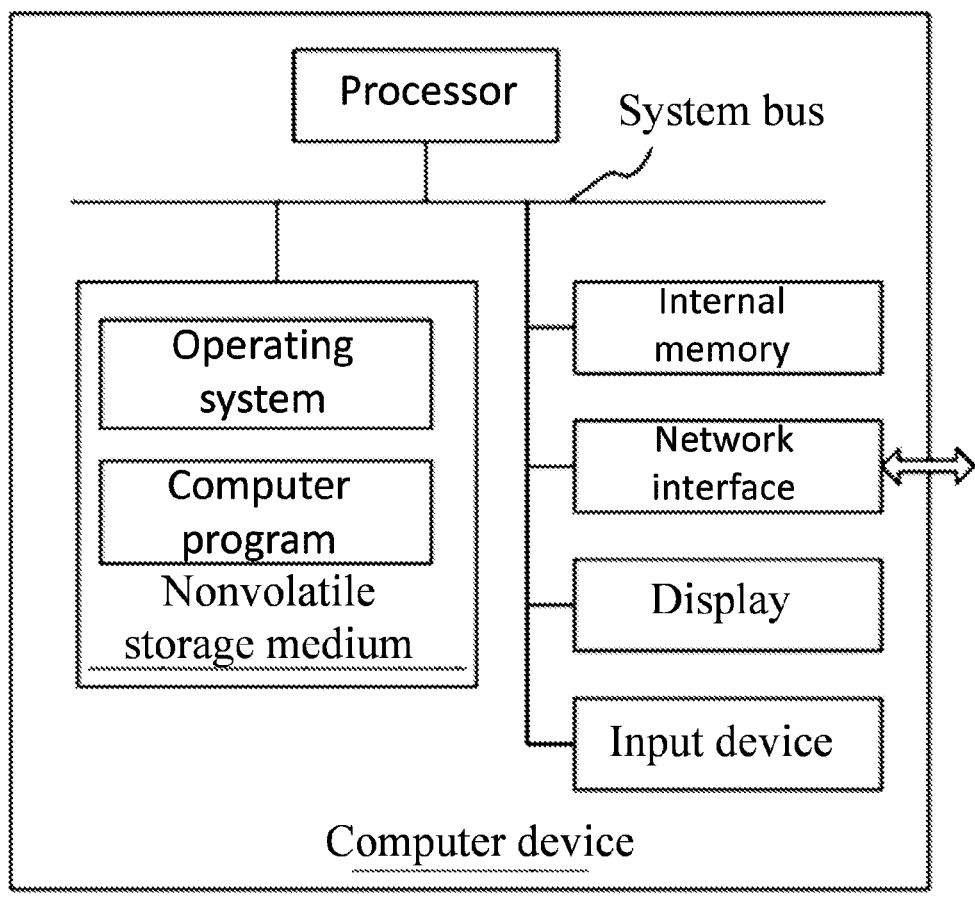
FIG. 10 is a schematic structural diagram of a computer device in one embodiment.

In an embodiment, a computer device is provided. The computer device may be a terminal, and an internal structure of the computer device may be as shown in FIG. 10. The computer device includes a processor, a memory, a network interface, a display screen and an input apparatus which are connected by means of a system bus. The processor of the computer device is configured to provide computation and control ability. The memory of the computer device includes a nonvolatile storage medium and an internal memory. The nonvolatile storage medium stores an operating system and computer programs. The internal memory provides an environment for running the operating system and the computer programs in the nonvolatile storage medium. The network interface of the computer device is configured to communicate with an external terminal by means of network connection. The computer programs, when executed by the processor, implement alarm triggering and connection/disconnection control of the liquid-cooling flow channels. The display screen of the computer device may be a liquid crystal display screen or an e-ink display screen. The input apparatus of the computer device may be a touch layer covering the display screen, or may be a key, a trackball, or a touchpad disposed on a housing of the computer device, or may be an external keyboard, touchpad, a mouse or the like.

A person skilled in the art may understand that, the structure shown in FIG. 10 is merely a block diagram of a partial structure related to a solution in the present application, and does not constitute a limitation to the computer device to which the solution in the application is applied. Specifically, the computer device may include more components or fewer components than those shown in the figure, or some components may be combined, or a different component deployment may be used.

In one embodiment, a computer device is provided, which includes a memory, a processor, and computer programs stored on the memory and capable of running on the processor. The processor implements the following operations when executing the computer programs:

when a temperature monitoring module monitors that the temperature of cooling liquid is greater than a first preset value, and/or, when a flow rate monitoring module monitors that the flow rate of the cooling liquid is less than a second preset value, triggering an alarm module to issue an alarm.

In one embodiment, the processor, when executing the computer programs, also implements the following operations:

when the temperature monitoring module monitors that the temperature of the cooling liquid is greater than the first preset value, closing an electromagnetic guide valve to cut off a current liquid-cooling flow channel.

In an embodiment, provided is a computer-readable storage medium having computer programs stored thereon. The computer programs, when executed by a processor, implement the following operations:

when a temperature monitoring module monitors that the temperature of cooling liquid is greater than a first preset value, and/or, when the flow rate monitoring module monitors that the flow rate of the cooling liquid is less than a second preset value, triggering an alarm module to issue an alarm.

In one embodiment, the computer programs, when executed by the processor, also implement the following operations:

when the temperature monitoring module monitors that the temperature of the cooling liquid is greater than the first preset value, closing an electromagnetic guide valve to cut off a current liquid-cooling flow channel.

Those ordinary skilled in the art may understand that implementing all or part of the process in the method of the above embodiments may be completed by instructing related hardware through computer programs. The above-mentioned programs may be stored in a nonvolatile computer-readable storage medium, and when executed, the computer programs may include the process of the embodiments of the above-mentioned method. Any reference to memories, storage, database or other media used in the embodiments provided in the present application may include nonvolatile and/or volatile memory. The nonvolatile memory may include a read only memory (ROM), a programmable ROM (PROM), an electronic programmable ROM (EPROM), and an electronic erasable programmable ROM (EEPROM) or flash memory. The volatile memory may include a random access memory (RAM) and/or external cache memory. As for illustration rather than limitation, RAM is available in many forms, such as static RAM (SRAM), dynamic RAM (DRAM), synchronous DRAM (SDRAM), double data rate SDRAM (DDRSDRAM), enhanced SDRAM (ESDRAM), synchronous link DRAM (SLDRAM), memory bus (Rambus) direct RAM (RDRAM) and direct memory bus dynamic RAM (DRDRAM), and memory bus dynamic RAM (RDRAM), etc.

Technical features of the foregoing embodiments may be randomly combined. To make description concise, not all possible combinations of the technical features in the foregoing embodiments are described. However, the combinations of these technical features shall be considered as falling within the scope recorded by the present specification provided that no conflict exists.

The foregoing embodiments only describe several implementations of the present application, which are described specifically and in detail, but cannot be construed as a limitation to the patent scope of the present application. It is to be noted that for a person of ordinary skill in the art, several transformations and improvements can be made without departing from the idea of the present application. These transformations and improvements belong to the protection scope of the present application. Therefore, the protection scope of the patent of the present application shall be subject to the appended claims.

What is claimed is:

1. An immersion liquid-cooling system, applied to an immersion heat-exchange cavity, and the immersion liquid-cooling system comprising:

a liquid distributor and a liquid collector, arranged at two sides of the immersion heat-exchange cavity;

wherein the liquid distributor, the liquid collector and the immersion heat-exchange cavity are each provided with a plurality of flow channels, flow channel outlets of the liquid distributor are connected with flow channel inlets of the immersion heat-exchange cavity in a one-to-one correspondence, and flow channel outlets of the immersion heat-exchange cavity are connected with flow channel inlets of the liquid collector in a one-to-one correspondence; and wherein cooling liquid distributed by the plurality of flow channels of the liquid distributor flows out of the plurality of flow channels of the liquid collector along the plurality of flow channels of the immersion heat-exchange cavity to form liquid-cooling flow channels;

the immersion heat-exchange cavity comprises at least two device nodes connected in series; at least one of the liquid collector or the liquid distributor is arranged between a preceding device node and a succeeding device node of adjacent device nodes of the at least two device nodes;

wherein the liquid collector and the liquid distributor each comprises a liquid collection pipe, a liquid cavity and a flow homogenizer, the flow homogenizers of the liquid collector and the liquid distributor are provided with the plurality of flow channels, the flow homogenizers of the liquid collector and the liquid distributor are detachably connected with the liquid cavities of the liquid collector and the liquid distributor, unidirectional deflectors opening towards one side of the flow channel outlets of the liquid distributor are arranged at flow channel inlets of the liquid distributor and unidirectional deflectors opening towards one side of flow channel outlets of the liquid collector are arranged at the flow channel inlets of the liquid collector.

2. The immersion liquid-cooling system of claim 1, wherein the at least two device nodes are connected in series in a sequence of temperature specifications from low to high, a device node of the at least two device nodes with a lowest temperature specification is closest to the liquid distributor, and a device node of the at least two device nodes with a highest temperature specification is closest to the liquid collector.

3. The immersion liquid-cooling system of claim 1, further comprising:

a heat exchanger in communication with the liquid collector and the liquid distributor;

wherein the cooling liquid flows out of the liquid collector after being cooled by the heat exchanger and then flows into the immersion heat-exchange cavity through the liquid distributor to form liquid-cooling circulation.

4. The immersion liquid-cooling system of claim 1, wherein the cooling liquid flows out of the immersion heat-exchange cavity successively through the plurality of flow channels of the flow homogenizer of the liquid collector, the liquid cavity of the liquid collector and the liquid collection pipe of the liquid collector.

5. The immersion liquid-cooling system of claim 1, wherein at least one of a length of each of the plurality of flow channels of the liquid distributor, of the liquid collector and of the immersion heat-exchange cavity or a diameter of each of the plurality of flow channels of the liquid distributor, of the liquid collector and of the immersion heat-exchange cavity is determined by a heat dissipation requirement of a device unit through which the cooling liquid flows.

6. The immersion liquid-cooling system of claim 5, wherein one side of the flow homogenizer of the liquid distributor close to the liquid cavity of the liquid distributor and one side of the flow homogenizer of the liquid collector close to the liquid cavity of the liquid collector are in a semicircular arc shape.

7. The immersion liquid-cooling system of claim 6, wherein a second side of the flow homogenizer of the liquid distributor away from the liquid cavity of the liquid distributor and a second side of the flow homogenizer of the liquid collector away from the liquid cavity of the liquid collector are in the semicircular arc shape, an arc-shaped concave surface of the flow homogenizer of the liquid distributor is concave towards one side of the liquid collection pipe of the liquid distributor, and an arc-shaped concave surface of the flow homogenizer of the liquid collector is concave towards one side of the liquid collection pipe of the liquid collector.

8. The immersion liquid-cooling system of claim 1, further comprising a circulating pump and a valve arranged between the circulating pump and the liquid distributor;

wherein the circulating pump is in communication with a heat exchanger and the liquid distributor; and the cooling liquid cooled by the heat exchanger is pressurized by the circulating pump and then pumped into the liquid distributor.

9. A server, comprising an immersion heat-exchange cavity and an immersion liquid-cooling system, wherein the immersion liquid-cooling system comprises:

a liquid distributor and a liquid collector, arranged at two sides of the immersion heat-exchange cavity;

wherein the liquid distributor, the liquid collector and the immersion heat-exchange cavity are each provided with a plurality of flow channels, flow channel outlets of the liquid distributor are connected with flow channel inlets of the immersion heat-exchange cavity in a one-to-one correspondence, and flow channel outlets of the immersion heat-exchange cavity are connected with flow channel inlets of the liquid collector in a one-to-one correspondence; and wherein cooling liquid distributed by the plurality of flow channels of the liquid distributor flows out of the plurality of flow channels of the liquid collector along the plurality of flow channels of the immersion heat-exchange cavity to form liquid-cooling flow channels;

the immersion heat-exchange cavity comprises at least two device nodes connected in series; at least one of the liquid collector or the liquid distributor is arranged between a preceding device node and a succeeding device node of adjacent device nodes of the at least two device nodes;

wherein the liquid collector and the liquid distributor each comprises a liquid collection pipe, a liquid cavity and a flow homogenizer, the flow homogenizers of the liquid collector and the liquid distributor are provided with the plurality of flow channels, the flow homogenizers of the liquid collector and the liquid distributor are detachably connected with the liquid cavities of the liquid collector and the liquid distributor, unidirectional deflectors opening towards one side of the flow channel outlets of the liquid distributor are arranged at flow channel inlets of the liquid distributor and unidirectional deflectors opening towards one side of flow channel outlets of the liquid collector are arranged at the flow channel inlets of the liquid collector.

10. The server of claim 9, wherein the at least two device nodes are connected in series in a sequence of temperature specifications from low to high, a device node of the at least two device nodes with a lowest temperature specification is closest to the liquid distributor, and a device node of the at least two device nodes with a highest temperature specification is closest to the liquid collector.

11. The server of claim 9, wherein the immersion liquid-cooling system further comprises:

a heat exchanger in communication with the liquid collector and the liquid distributor;

wherein the cooling liquid flows out of the liquid collector after being cooled by the heat exchanger and then flows into the immersion heat-exchange cavity through the liquid distributor to form liquid-cooling circulation.

12. The server of claim 9, wherein the immersion liquid-cooling system further comprises a circulating pump and a valve arranged between the circulating pump and the liquid distributor;

wherein the circulating pump is in communication with a heat exchanger and the liquid distributor; and the cooling liquid cooled by the heat exchanger is pressurized by the circulating pump and then pumped into the liquid distributor.

13. The server of claim 9, wherein at least one of a length of each of the plurality of flow channels of the liquid distributor, of the liquid collector and of the immersion heat-exchange cavity or a diameter of each of the plurality of flow channels of the liquid distributor, of the liquid collector and of the immersion heat-exchange cavity is determined by a heat dissipation requirement of a device unit through which the cooling liquid flows.

* * * * *